United States Patent [19]
Natter

[11] Patent Number: 5,352,310
[45] Date of Patent: Oct. 4, 1994

[54] ACTINIC ACTIVATION SHAPING SYSTEM AND METHOD

[76] Inventor: Marc D. Natter, Honatech, Inc., 185 Riverdale Ave., Yonkers, N.Y. 10705

[21] Appl. No.: 904,023

[22] Filed: Jun. 25, 1992

Related U.S. Application Data

[63] Continuation-in-part of Ser. No. 312,613, Feb. 17, 1989, Pat. No. 5,174,843.

[51] Int. Cl.⁵ .............................................. B32B 31/00
[52] U.S. Cl. .................................. 156/155; 156/273.3; 156/273.5; 156/275.5; 156/307.1; 264/22; 425/174.4
[58] Field of Search ................ 156/235, 238, 249, 237, 156/381, 272.2, 272.8, 273.3, 273.5, 275.5, 58, 59, 155, 246, 307.1, 307.5; 430/269, 281, 296, 328, 329, 330, 331, 394, 945; 264/22; 425/174.4

[56] References Cited

U.S. PATENT DOCUMENTS

| | | | |
|---|---|---|---|
| 4,081,276 | 3/1978 | Criuello | 96/35.1 |
| 4,961,154 | 10/1990 | Pomerantz et al. | 264/22 X |
| 5,088,047 | 2/1992 | Bynum | 156/272.8 X |
| 5,094,935 | 3/1992 | Vassiliou et al. | 156/59 X |
| 5,183,598 | 2/1993 | Hellé et al. | 156/272.8 X |

OTHER PUBLICATIONS

Fudim, E. V., "Sculpting Parts with Light," Machine Design Mar. 6, 1986 pp. 102–106.

Primary Examiner—Chester T. Barry
Attorney, Agent, or Firm—Natter & Natter

[57] ABSTRACT

The three dimensional configuration of an article is generated from a plurality of sheets of polymer material having a base resin constituent, a reactive diluent constituent and a reaction modifying constituent which effects a latent change in chemical reactivity of the polymer material in an area of each sheet imaged with actinic radiation in the configuration of an incremental heighth of the article, successive sheets are exposed to actinic radiation corresponding to the configuration of successive incremental planar heights of the article and are stacked in a matrix. The imaged areas of all sheets are thereafter simultaneously cured with heat or aging, the configuration of the article is separated from the remainder of the matrix by altering the dimensional stability of the uncured polymer material. The sheets may be initially positioned on a carrier web for transport through an apparatus for constructing the shape of an article. The apparatus includes an imaging station wherein successive sheets are exposed to actinic radiation and a stacking station wherein exposed sheets are stripped from the carrier web and placed in a stack to form the matrix.

14 Claims, 3 Drawing Sheets

ACTINIC ACTIVATION SHAPING SYSTEM AND
METHOD

RELATED APPLICATIONS

This is a continuation-in-part of application Ser. No. 07/312,613 filed Feb. 17, 1989 entitled: MATRIX SUPPORT ARTICLE SHAPING SYSTEM AND METHOD issued Dec. 29, 1992 as U.S. Pat. No. 5,174,843.

BACKGROUND OF THE INVENTION

1. Field of the Invention

This invention relates generally to the formation of a solid article from a mathematical or graphical representation and more particularly to a system for generating the shape of an article by actinic irradiation of successive sheets which comprise a matrix which supports the article during formation.

2. Related History

Since the implementation of computer technology for physical design purposes, there has been an appreciation of the need for expanding use of computers to control the fabrication of prototypes of articles which have been designed. While the principle of irradiating an article to effect changes in molecular structure and physical properties has been long recognized, such phenomenon had not been employed for the purpose of generating three-dimensional articles until recent years. In this regard, attempts have been made to utilize a fluid medium containing a curable material which was irradiated by a plurality of beams. The energy level at the intersection of the beams was sufficient to cure the material within the fluid medium. Such apparatus did not gain widespread acceptance due to many inherent disadvantages including cost, resolution difficulties and insufficient energy levels as a result of absorption as the depth of beam penetration into the fluid medium increased.

In U.S. Pat. No. 4,575,330, an apparatus for constructing an article by ultra violet polymerization of the upper surface of a photopolymeric fluid medium was disclosed. Successive layers of the article were generated by successively lowering built up polymerized layers into the fluid medium so that the upper surface of the fluid medium contained unpolymerized material suitable for polymerization and generation of the next layer.

While the apparatus did not require multiple beams, it suffered from several disadvantages, including restricted photopolymeric material requirements. It was limited to use with ultra violet beams and required photopolymers responsive to the ultra violet wavelengths. In addition, difficulties were encountered in maintaining the upper surface of the fluid medium at a planar reference level due to fluid turbulence, reduction in fluid level as a result of the polymerization of prior layers and uneven shrinkage of the polymerized material. Also, the apparatus lacked precise control over the depth of polymerization into the fluid medium which resulted in loss of axial resolution.

Further, because a fluid medium was used, the article being constructed could not be supported except by the underlying built up article layers and a support platform, movable within the medium, was required. As such, articles having surfaces contoured with undercuts and the like could not be generated without providing a complicated mechanism capable of moving the platform aloha multiple axes.

In addition, in order to provide sufficient energy levels for curing, the maximum scan speed of the ultra violet beam was relatively slow, resulting in a correspondingly slow overall throughput.

In copending application Ser. No. 07/312,613 filed Feb. 17, 1989, an article shaping system was described wherein sheets of thermoplastic polymer mixture were stacked on a platen and the uppermost sheet was irradiated with an electron beam deflected to trace the configuration of a incremental planar heighth of the article. The beam effected cross-linking of the polymer along the trace to convert, for example, a thermoplastic polymer to a thermoset. As successive sheets were placed on top of one another and irradiated, the stack formed a matrix which supported the built up configuration of the article. The matrix was thereafter removed by heat and/or solvents. Such system provided enhanced image resolution, reduced mechanical complexity and greater material compatibility than prior methods. Throughput was increased because the electron beam provided an efficient irradiation source and the sheets could be stacked and referenced rapidly.

Unfortunately, the production of large and detailed components could still take many hours. Further, the efficient production of a suitable electron beam required expensive evacuation hardware systems and high voltage biasing equipment. Additionally, image penetration into underlying sheets presented a problem which could be alleviated by precise control of the beam energy level or the use of sheets of polymer mixture with depthwise varying degrees of reactivity.

SUMMARY OF THE INVENTION

A system for computer aided generation of three dimensional articles utilizes sheets of thermoplastic polymer mixture adhered in discrete locations on a continuous carrier web. Successive sheets are individually imaged with actinic radiation in the configuration of successive incremental planar heighths of the article. The actinic radiation affects the tendency of the imaged areas of each sheet to undergo subsequent curing which results in a modification of a physical property such as a change in solubility and/or rheology. The irradiated sheets are stripped from the carrier web and stacked in a matrix. The imaged areas of all sheets are simultaneously cured with heat and/or aging.

Depending upon the particular polymer mixtures employed, the actinic radiation serves, e.g. to facilitate subsequent curing which changes a thermoplastic into a thermoset or alters the solubility of a constituent polymer in a particular solvent by modifying functional side groups of linearly branched polymer chain structures and/or the molecular weight of the polymer.

The polymer mixture chosen for the sheets comprises a base resin, a reactive diluent and a reaction modifying compound coupled with an activating compound responsive to the radiation employed for imaging. Although the components of the polymer mixture are functionally distinct, they are not required to be physically distinct.

For catalytically induced reactions, the base resins are typically higher molecular weight polymers which act as film formers and contain functional groups typical of such reactions, e.g. epoxy, hydroxy, carboxy. The reactive diluents contain mono or multi-functionalities typically co-reactive with those of the base resin, and are generally lower molecular weight monomers, oligomers, or prepolymers which, when reacted with the base resin, substantially alter the physical and/or chemical properties of the polymer mixture. Reaction modifying compounds include cationic photo catalysts such as diaryliodonium, triarylsulfonium, and mixed-ligand arene cyclopentadienyl metal salts, and may also include photosensitizers compatible with such catalysts.

In lieu of catalytic activation mechanisms, an article shape can be realized through a photo-activated deprotection of reactive functionalities which results in subsequent polymer structure modification. The base resins employed are film forming polymers which may contain blocked and/or mutually non-reactive free functionalities such as suitable combinations of hydroxyl, aldehyde, amine, and isocyanate moieties. The reactive diluents contain mono- or multi-functionalities which may be co-reactive with those of the base resin. The diluents are generally lower molecular weight monomers, oligomers and prepolymers with blocked and/or mutually non-reactive free functionalities.

The reaction modifying protecting groups are previously reacted with specific functionalities in either the base resin or the reactive diluent or both, and cleave under actinic radiation to free these functionalities. Cleavage may be obtained by a direct photolytic activation, or indirectly such as by a photo-catalyzed deblocking. Additional photo-sensitizing compounds may be used to alter the spectral response of these reactions.

The sheets of polymer mixture are adhered onto the carrier web in discrete areas and comprise a substantially uniform thickness stratum of polymer mixture. When the stratum is not typically self-adherent, a substratum or tack layer may be formed of a polymer mixture similar to the stratum with lower molecular weight constituents or additional tackifying resins to temporarily adhere the sheet to the web and to thereafter adhere imaged sheets to one another when stacked.

An apparatus for imaging and consolidating the sheets includes a mechanism for transporting successive sheets carried on the web to an imaging station and for transporting the imaged sheets to a stacking station. The imaging station includes a cathode ray tube or a sequence of photomasks, and an optical projection system. At the stacking station the sheets are stripped from the web and placed on a stack which forms a matrix.

The image irradiated on each sheet comprises the configuration of the article to be formed at an incremental heighth which conforms to the thickness and position of such sheet. The actinic radiation initiates a modification of the reactive properties of the imaged areas on a sheet. Under the subsequent influence of heat and/or age curing, a substantially simultaneous differentiation of the image and non-image areas of the sheets occurs. After curing, the remainder of the stack is removed by heat, pressure or chemical dissolution or dispersion.

From the foregoing compendium, it will be appreciated that it is an aspect of the present invention to provide an article shaping system of the general character described which is not subject to the disadvantages of the related history aforementioned.

A feature of the present invention is to provide an article shaping system of the general character described capable of constructing three-dimensional prototypes of computer designed articles with precise dimensional accuracy.

A consideration of the present invention is to provide an article shaping system of the general character described which does not require complex mechanical structures or multiple irradiation beams to form intricate shapes.

It is another consideration of the present invention to provide an article shaping system of the general character described wherein the article may be formed from a wide variety of materials having different physical properties.

Another feature of the present invention is to provide an article shaping system of the general character described capable of generating a three-dimensional article with relatively high speed.

To provide an article shaping system of the general character described which is relatively low in cost is a further aspect of the present invention.

Providing a computer controlled article shaping system of the general character described with enhanced vertical definition is another aspect of the present invention.

A further consideration of the present invention is to provide an article shaping system of the general character described which utilizes low intensity actinic rays for configuring an article shape in successive sheets of a built up support matrix.

Another feature of the present invention is to provide an article shaping system of the general character described which utilizes actinic imaging for initiating latent chemical modification in the form of the shape of an incremental planar heighth of an article on successive sheets of a support matrix.

A still further feature of the present invention is to provide a method of the general character described for shaping an article whereby the configuration of the article is generated by latent imaging of sheets which are stacked to provide a support matrix for the article as its shape is being generated.

Yet another aspect of the present invention is to provide an article shaping system of the general character described which is relatively simple to use.

Other aspects, features and considerations in part will be obvious and in part will be pointed out hereinafter.

With these aims in view, the invention finds embodiment in certain combinations of elements, arrangements of parts and series of steps by which the said aspects, features and considerations and certain other aspects, features and considerations are attained, all with reference to the accompanying drawings and the scope of which is more particularly pointed out and indicated in the appended claims.

BRIEF DESCRIPTION OF THE DRAWINGS

In the accompanying drawings in which is shown one of the various possible exemplary embodiments of the invention.

DESCRIPTION OF THE PREFERRED EMBODIMENT

Referring now in detail to the drawings, the reference numeral 10 denotes generally an actinic activation shaping system constructed in accordance with and embodying the invention. In overview, the system 10 generates a matrix 12 comprising a laminate of sheets which constitutes a medium for carrying the exposed latent image of an article 14.

The matrix 12 is generated by stacking individual sheets 16 of a differentially reactive polymer mixture. The thickness of each sheet 16 corresponds to an incremental heighth of the article or articles 14 which are being formed. Pursuant to the invention, each sheet 16 is irradiated with actinic rays bearing the focused image of the configuration of an incremental planar heighth of the article 14 with successive imaged sheets 16 being adhered over previously imaged sheets in a stack 15 to build up the composite matrix 12.

Figure 1:
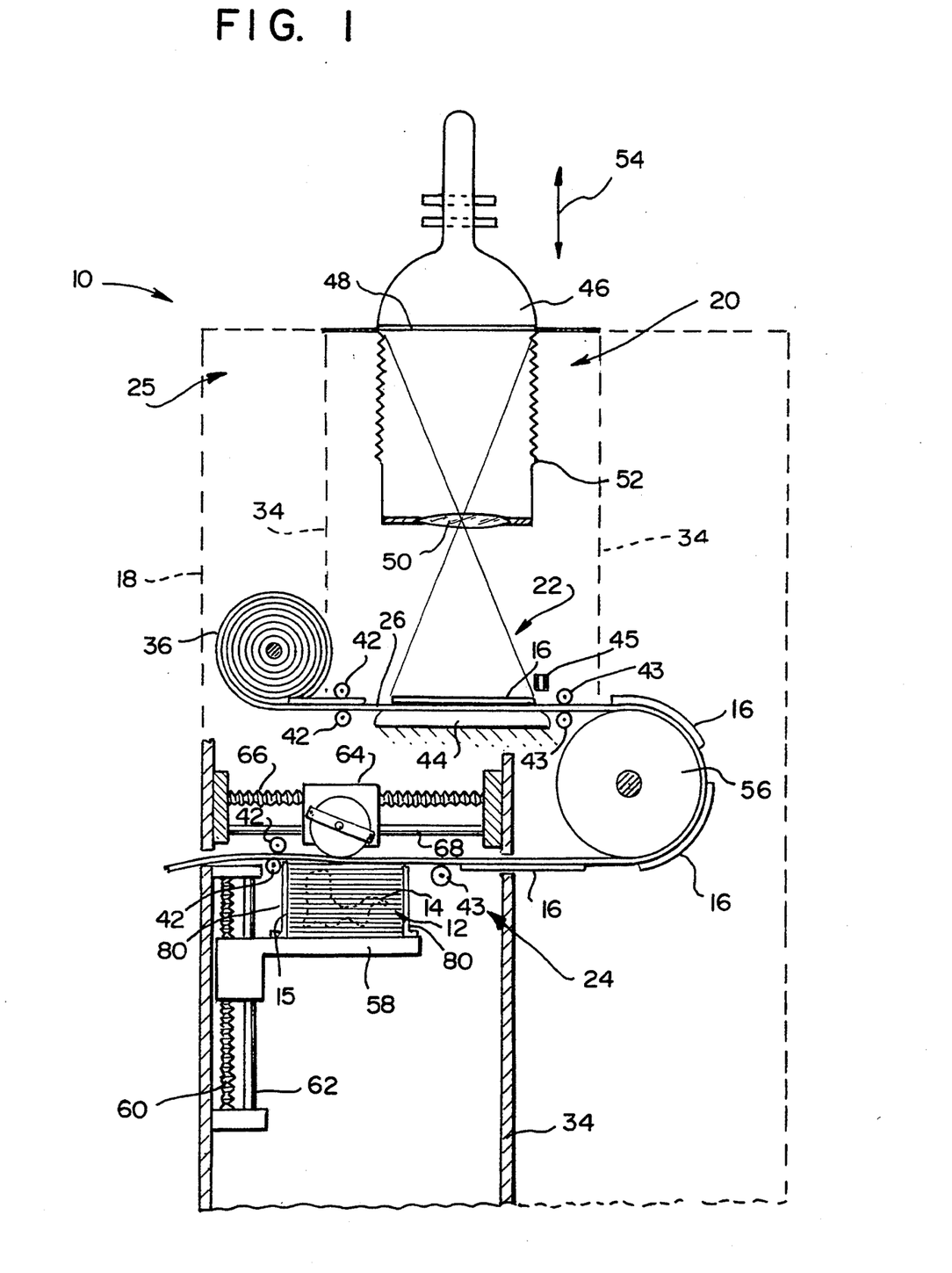
FIG. 1 is a schematized diagram of an actinic activation shaping system constructed in accordance with the present invention, with portions deleted for clarity and showing a compartment where successive sheets of polymer mixture carried on a web are stored, an imaging station where the sheets are irradiated and a stacking station wherein irradiated sheets are stripped from the web and deposited in a stack; also shown is a sheet transport mechanism.

The system 10 is preferably encased in a housing 18 and includes an imaging station 22 having an optical projection system 20. Also included in the system is a transport mechanism which transports sheets to the imaging station 22 and from the imaging station to a stacking station 24 wherein exposed sheets are stripped from a carrier web 26 and placed in a stack 15 to form the matrix 12.

Upon stacking of the last sheet of the matrix 12, the irradiated latent images on all sheets undergo substantially simultaneous curing to effect a physical and/or chemical modification, for example, converting the thermoplastic mixture of each sheet into a thermoset at the imaged area or, alternatively, alteration of the structure or molecular weight of the polymer mixture to affect solubility. Thereafter, the article 14 is separated from the matrix 12 by dissolving, melting or dispersing the remainder of the sheets 16 forming the matrix.

With the foregoing overview in mind, it should be noted that individual sheets 16 of the polymer mixture are deposited on the continuous carrier web 26 in discrete assigned areas. The sheets 16 are preferably of controlled uniform thickness and are deposited at defined areas of the carrier web 26 with the carrier web 26 including precisely spaced indexing marks 28 illustrated in FIG. 3. The indexing marks 28 may be configured for optical, magnetic or other sensing at both the imaging station 22 and the stacking station 24 so that precise lateral registration of imaged incremental heighths of the article is assured.

Figure 4:
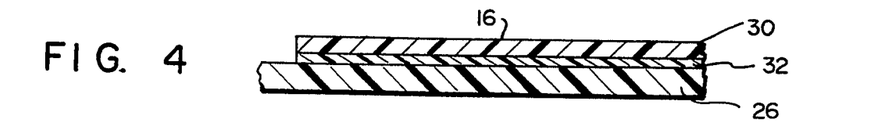
FIG. 4 is an enlarged scale fragmentary sectional view through the web and the sheet, the same being taken substantially along the line 4—4 of FIG. 3.
Figure 5:
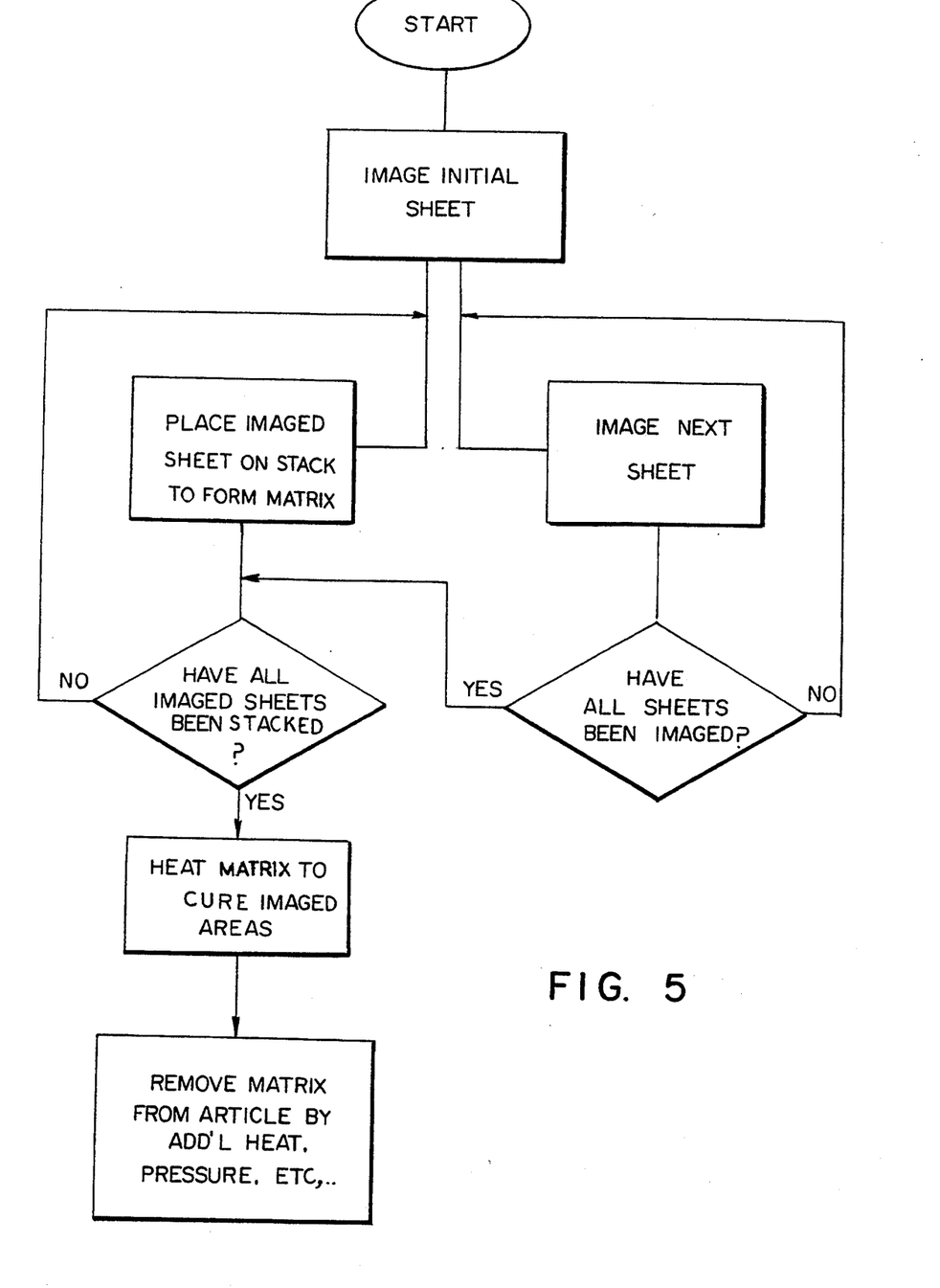
FIG. 5 is a flow diagram showing the various steps in a method of forming an article in accordance with the present invention.

Preferably, each sheet 16 comprises a primary layer or stratum 30 of substantially uniform thickness and a tack layer 32 or substratum positioned between the stratum 30 and the carrier web 26. The tack layer 32 serves to adhere each sheet 16 to the carrier web 26 until the sheet is stripped from the web and deposited on top of the stack 15. In the sectional illustration of FIG. 4, the sheet 16 is shown in greatly exaggerated and disproportionately enlarged thickness. The thickness of a typical sheet 16 is in the order of, for example, 0.0002 in. to 0.010 in. while the thickness of the carrier web 26 is in the order of, for example, 0.001 in. to 0.007 in.

In order to reduce irradiation time and provide efficient throughput for the system 10, the polymer mixture of which the sheets 16 is formed should be highly sensitive to visible and/or UV radiation. For such reason, the housing 18 should be of light tight construction and may include internal baffles 34 to minimize light leakage between various stations of the system.

Figure 3:
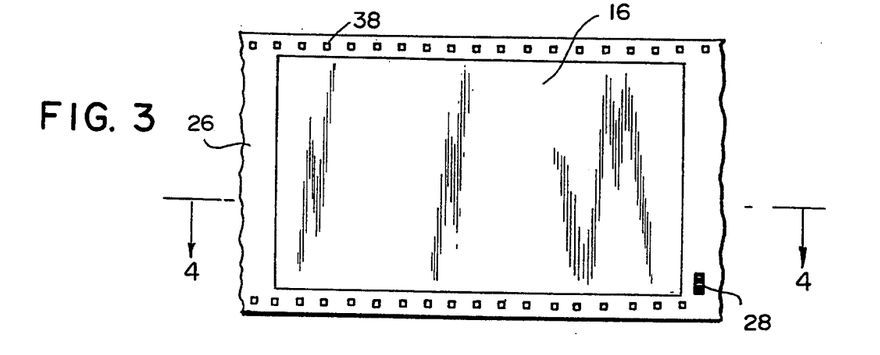
FIG. 3 is a fragmentary plan view of a portion of the web and showing an individual sheet carried thereon and an index mark on the web.

In accordance with the invention, the successive sheets 16, carried on the carrier web 26 are preferably stored at a light proof compartment 25 of the housing 18 spooled on a roll 36 with the web 26 extending from the spooled roll 36 and being threaded through the imaging station 22 and into the stacking station 24. A transport mechanism 38 for advancing the carrier web comprises a plurality of drive sprockets 42 and tension sprockets 43 which include teeth for engagement into sprocket openings 38 formed adjacent each of the longitudinal edges of the carrier web as illustrated in FIG. 3.

Figure 6:
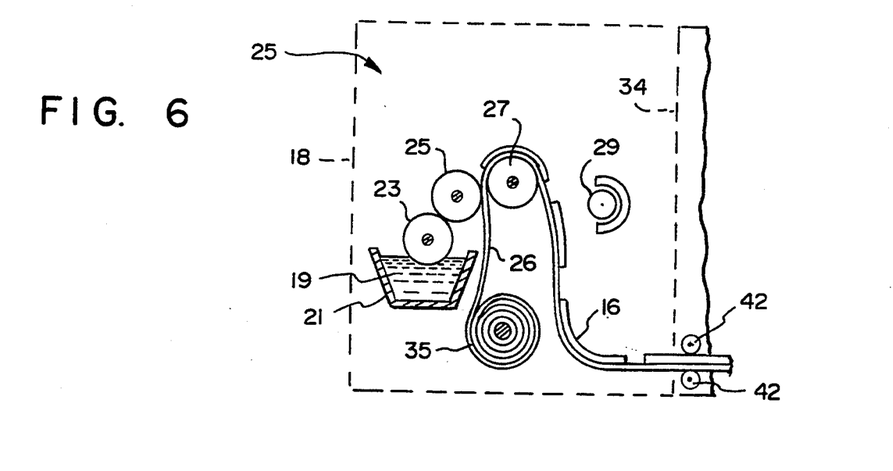
FIG. 6 is a fragmentary schematized diagram of an alternate embodiment of the system wherein the compartment houses an apparatus for coating the sheets on the web.

Alternatively, the successive sheets 16 may be formed within the compartment 25 from a liquid precursor mixture 19 carried in a reservoir 21, and coated on the carrier web 26 as it is fed from a coil 35, illustrated in FIG. 6. The reservoir 21 may contain the polymeric precursor mixture 19 in a form which is readily processed into thin sheets, for example the precursor mixture may be molten, a solvent solution or an aqueous dispersion, or a plastisol. The mixture 19 may alternately comprise a polymerizable liquid monomeric or oligomeric mixture which may then be thermally polymerized to yield sheets 16 of actinically activatable polymer mixture, or polymerized via radiation beyond the latent actinic sensitivity of the sheets.

The mixture 19 is metered from the reservoir and the sheets 16 are coated on the carrier web 26 through conventional coating apparatus such as a plurality of transfer rolls 23, 25, 27 or a rotary screen system. The final transfer roll 27 may include a heating element to convert the precursor mixture into polymer sheets. Alternatively, a baffled curing lamp 29 may be employed for selective photopolymerization of the precursor mixture.

With attention redirected to the embodiment of FIG. 1, the roll 36 is positioned in a loading station within the compartment 25 and a first set of opposed drive sprockets 42 advances the web and the sheets 16 to the imaging station 22. At the imaging station 22, the carrier web is positioned over an imaging platen 44 through use of the indexing mark 28 which is sensed, either magnetically or optically by a sensor 45.

The optical projection system 20 generates and projects an image pattern of the configuration of the incremental heighth of the article 14, corresponding to the assigned position of the sheet in the stack 15. Alternately, the projected image may comprise a negative image of the incremental heighth of the article 14 in which instance actinic irradiation serves to retard or hinder the cure response.

The image is generated through a cathode ray tube 46 having a face plate 48 coated with phosphors whose wavelength spectrum coincides with that of the photoactive constituents of the thermoplastic polymer mixture of which the sheet 16 is formed.

The image pattern appearing on the face plate 48 is focused and projected through a lens 50 carried at a distal end of a light tight bellows assembly 52. Movement of the cathode ray tube and/or the lens in the direction of the heavy arrows 54 permits appropriate scaling and precise focusing of the image which is projected on the sheet 16. The plane of the image is coincident with the plane of the sheet as referenced by the imaging platen.

Since the sheet being imaged is not on top of a stack of sheets, image penetration to an underlying sheet of the stack 15 is avoided in a relatively simple fashion and fine vertical definition of the article 14 is assured.

Alternate imaging systems may be employed. For example, a fiber optics system may be employed with single line generation of the image as the sheet is advanced incrementally. Further, a complete fiber optic face plate may be employed for imaging the entire sheet simultaneously. Also contemplated are image production methods utilizing a liquid crystal display screen, optical mask and laser scanning.

Optionally, the carrier web 26 may comprise a photosensitive film medium which is threaded through the imaging station inverted, i.e. with the web 26 facing the projection system 20. The web 26 is imaged and then passes through a developing station. After development of the image, the web 26 passes through a second imaging station wherein the sheets 16 are exposed to high intensity visible or ultra violet light and with the developed image on the film web functioning as a mask.

After imaging, the sheet 16 is advanced to the stacking station 24 by motor driven operation of the drive sprockets 42. A drum or roller 56 may be provided for guidance and inversion of the carrier web prior to entry into the stacking station 24. The stacking of imaged sheets need not occur immediately after imaging. Imaged sheets may be coiled and later removed from the carrier web and stacked.

At the stacking station 24, the system includes a vertically adjustable platform 58. Vertical positioning of the platform 58 is achieved through the use of a threaded shaft 60 driven by a motor. One or more vertical guide rails 62 extend through linear bearings in the platform 58 to provide stability. The platform 58 is incremented downwardly as successive sheets 16 are placed upon the stack 15 to form the composite matrix 12.

The stacking station 24 also includes a carriage 64 mounted for reciprocal movement along a horizontal plane. The reciprocal movement of the carriage 64 is controlled by a motor driven threaded shaft 66 and guided by one or more horizontal rails 68 engaged in linear bearings fixed to the carriage 64. The carriage 64 includes a roller 70 mounted for rotation about an axis which is transverse to the direction of reciprocal movement of the carriage 64.

Figure 2:
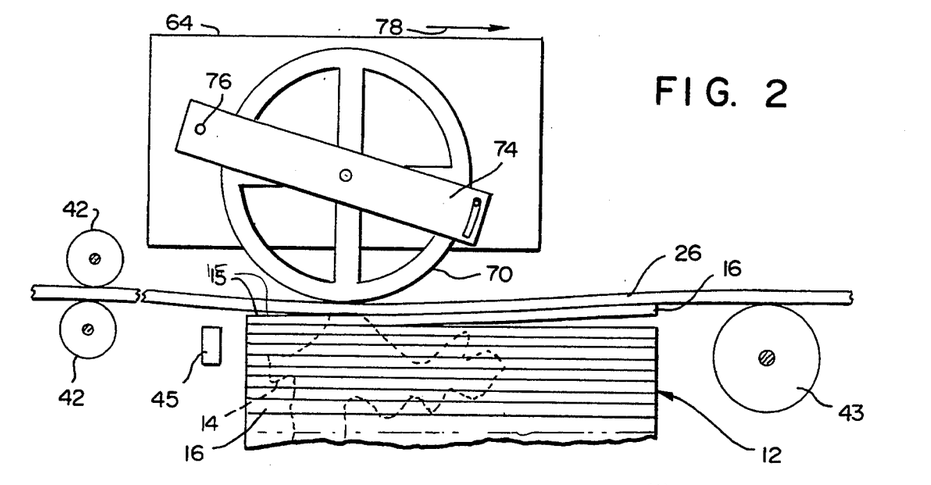
FIG. 2 is an enlarged scale elevational view of a portion of the stacking station with elements deleted for clarity and showing a reciprocating carriage having a contact roller for separating an imaged sheet from the web and bonding the sheet to the stack.

As best seen in FIG. 2 wherein the guide rails 68 and the shaft 66 have been omitted, the roller 70 is mounted about a journal 72 the ends of which extend through a pair of pivotal bracket arms 74. The bracket arms 74 are adjustable to raise or lower the rotation axis of the roller 70. At one end of the bracket arm 74, a pivot pin 76 is provided for mounting to a frame portion of the carriage 64 while at the other end, a pin extending from the carriage frame engages an arcuate slot of the bracket arm. Relative motion between the bracket arm 74 and the carriage frame is effected by a suitable mechanism, such as a solenoid.

It should be noted that in the position illustrated in FIG. 2, the carriage 64 is advancing toward the right and the bracket arms 74 are in their lowermost position so that the roller 70 is exerting rolling pressure on the sheet 16 which is being adhered to the underlying sheet on the stack 15 while being stripped from the carrier web 26.

The stacking station 24 includes a sensor 45 which assures that the latent image on the sheet is indexed at the proper position relative to the composite latent image in the stack. It should also be noted that the drive sprockets 42 of the stacking station are at an elevation slightly above the top of the stack 15 to induce separation between the tack layer 32 and the web 26. Upon initial positioning of the sheet 16, the carriage 64 and roller 70 are at the far left of the stack as viewed in FIG. 2, with the bracket arms 74 being lifted to elevate the roller 70 to a position above the stack. After the sheet 16 is properly positioned as sensed by the sensor 45, the roller 70 is lowered, forcing the sheet carried on the web against the exposed tack layer 32 of the uppermost sheet on the stack. The threaded shaft 66 is then rotated, advancing the carriage 64 in the direction of the heavy arrow 78 toward the opposite end of the stack. The tension on the web 26 due to the drive sprockets 42 tends to lift the web from the sheet, as indicated in FIG. 2, stripping the sheet from the web. Upon completion of travel across the stack, the roller 70 is lifted to a position above the stack 15 and the carriage is moved toward the left to a home position.

Prior to or after the completion of roller travel across the stack, the platform 58 is incrementally lowered so that the top of the stack is at the same height relative to the web and roller for positioning of the next sheet.

After stacking of the last sheet to complete the matrix 12, the article shape is consolidated by either elevated temperature heat energy or ambient temperature heat energy over a period of time. The rate of development exhibits a strong dependence upon temperature, so that it may be desireable to heat the matrix to a temperature which exceeds the softening point or glass transition temperature. In such event, peripheral support is provided for the matrix in the form of a sleeve or container formed of, for instance, metal plates 80, plaster of paris or a polyester casting resin. After the ambient temperature has been reduced, the sleeve is removed and hereafter the remainder of the matrix which supports the article is removed by heat, solvent, dispersant, and/or pressure, either alone or in combinations. An application of pressure to effect removal of the remainder of the matrix may include cavitation, pressure washing, particle (sand or pellet) blasting and the like.

As previously mentioned, sheets 16 are formed of a polymer mixture which, after imaging, will undergo a subsequent change in a physical property such that the imaged area will be separable from the remainder of the compiled sheets. The polymer mixture 39 includes the following categories of constituents:

From 20% to 90% by weight of BASE RESIN;
From 10% to 90% by weight of REACTIVE DILUENT; and
from 0.5% to 70% by weight of REACTION MODIFIER.

Removal of the article from the matrix is premised upon elevated temperature thermal treatment or ambient temperature thermal aging to effect a differential change in the physical properties between imaged and non-imaged areas of the sheets comprising the matrix. The differential change in physical properties realized through thermal treatment or aging is accomplished by development of a latent reaction which modifies aspects of the structure or molecular weight of either the imaged or non-imaged areas of the polymer mixture of which the sheets are formed. Such modification occurs via crosslinking, polymerization, branching or chain scission of and between one or more components of the polymer mixture. The modified imaged or non-imaged areas of polymer material exhibit differential changes in solubility, dispersibility, melting point or rheology, boiling point or vapor pressure.

Depending upon the reaction modifiers employed, there are two basic types of reaction mechanisms capable of providing the desired change of physical property:

I. PHOTO-CATALYTICALLY INDUCED;
II. PHOTO-ACTIVATED DEPROTECTION.

The reaction modifiers in either mechanism undergo a substantially irreversible actinic conversion to form a latently developable image.

Reaction modifiers suitable for photocatalytically induced processes include all classes of acid-generating and cationic photoinitiators, such as those listed in Table 1, p. 64 of vol. 78 (1986) of *Advances in Polymer Science*, incorporated herein by reference, which singly or in combination with additional photosensitizers or synergists are capable of the actinic production of long-lived reaction-modifying species.

Additional acid-releasing photoinitiators include: alpha-chloroacetophenones, alpha-sulfonyloxyacetophenones, beta-sulfonyloxyacetophenones, sulfonyloxy-benzophenones, N-sulfonyloxyimides, quinolinium sulfonates, and silyl ether compounds. Onium salt photoinitiators such as the diaryliodonium and triarylsulfonium salts are commercially available from General Electric, 3M, and Union Carbide and may be sensitized to longer wavelengths by, for instance, anthracene, perylene, and phenothiazine.

Reaction-modifying compounds suitable for photo-activated deprotection processes include photosensitive protecting groups such as: 2-nitrophenylethylene glycol moieties for the protection of aldehyde and ketone functionalities; 2-nitrobenzaldehyde moieties for the protection of, for instance, hydroxy functionalities; 2,2'-dinitrodiphenylmethanol moieties for the protection of, for instance, carboxyl and amino functionalities; and other compounds as referred to in *Photosensitive Protecting Groups* by B. Amit, U. Zehavi and A. Patchornik, *Israel Journal of Chemistry*, Volume 12 (1974) pp. 103–113, *Photo-removable Protecting Groups in Organic Synthesis*, by V. N. R. Pillai, *Synthesis*, January, 1980, pp 1–26.

Reaction modifying compounds may also be obtained by combination of catalysts and protecting group compounds in which either or both are actinically activatable. Typically, these coreactive systems utilize antagonistic or synergistic reaction mechanisms to generate a cascaded cure response.

Examples of suitable base resins for use in conjunction with photo-catalytic induced reactions in accordance with the present invention include cellulose based polymers such as cellulose esters and cellulose ethers, for example, cellulose acetate-butyrate, ethyl cellulose, hydroxy propyl cellulose, ethoxy propyl cellulose, cellulose triacetate and cellulose acetate propionate.

Base resins may also be selected from epoxy prepolymers such as epoxy-cresol-novolac prepolymer, epoxy phenol-novolac prepolymer, and diglycidyl ethers of bisphenol A and bisphenol F. Additionally, a suitable base resin may be selected from the various readily available acrylic acid polymers and copolymers.

Further, suitable base resins include polyvinyl alcohol, polytetrahydrofurfuryl methacrylate, poly (methyl vinyl ether/maleic anhydride) copolymer, phenoxy polymers, and vinyl ethers referred to in U.S. Pat. No. 4,081,276, column 6, lines 61–68, incorporated herein by reference.

Examples of suitable reactive diluents for employment in photo-catalytic induced reactions are epoxy monomers, oligomers and prepolymers such as diglycidyl ethers of bisphenol A and bisphenol F, epoxy-cresol-novolac resins, epoxy-phenol-novolac resins, glycidyl phenyl ether and cycloaliphatic epoxy resins. Additional suitable reactive diluents include N-vinyl and vinyl ether functional compounds, and a wide range of polyols and organic polyacids.

Examples of suitable base resins for use in conjunction with photoactivated deprotection reactions include hydroxyl containing polymers such as polyvinyl alcohol and cellulose based polymers as previously set forth, copolymers of maleic anhydride such as with styrene and methyl vinyl ether, acrylic acid containing polymers, polyvinyl amine, isocyanate functionalized prepolymers, and aldehyde containing polymers such as dialdehyde starch.

Examples of suitable reactive diluents are pentaerythritol, polyethylene glycol, glutaraldehyde, hydroxyadipaldehyde, carboxyl-modified acrylonitrile-butadiene oligomers, polyethylene imine, phenyl isocyanate and toluene di-isocyanate.

The following table sets forth examples of typical constituents for photo-activated cationically catalyzed cross-linking of image areas.

TABLE 1

| Base Resin | Reactive Diluent |
|---|---|
| 1. Cellulose acetate-butyrate | Bisphenol-A epoxy resin |
| 2. Epoxy-phenol-novolac prepolymer | |
| 3. Poly tetrahydrofurfuryl methacrylate | Polyethylene Glycol |
| 4. Methyl vinyl ether/maleic anhydride copolymer | Glycerol |
| 5. Butyl Acrylate/ Acrylamidobutyraldehyde Diethyl Acetal Copolymer | Pentaerythritol |

Following development of cross-linking in the imaged areas, the non-imaged areas surrounding the article may be removed by the action of heat, pressure, solvents, or dispersants singly or in combination.

Table II sets forth typical polymer mixtures which undergo a photo-catalytically induced branching in imaged areas with cationic photocatalysts. Branching in the imaged areas results in a differential solubility or dispersibility with respect to non-imaged areas. Either imaged or non-imaged areas may be removed by appropriate choice of solvents or dispersants in possible combination with heat and/or pressure. If, for instance, pendant groups formed in branching are relatively non-polar while the original polymer mixture is largely polar, in general, a particular polar solvent or dispersant will remove the polar, non-imaged areas and leave the non-polar imaged areas intact. Conversely, a non-polar solvent or dispersant will generally act on non-polar areas and thereby remove the non-polar imaged areas.

TABLE II

| BASE RESIN | REACTIVE DILUENT | DISPERSANT OR SOLVENT TYPE |
|---|---|---|
| 1. Partially Hydrolyzed polyvinyl alcohol | Nonanoic Lactone | aqueous (non-imaged) |
| 2. Hydroxypropyl cellulose | Glycidyl Phenyl Ether | aqueous (non-imaged) |
| 3. Styrene-maleic anhydride copolymer | Diethylene glycol monolaurate | toluene (imaged) |
| 4. Ethyl Cellulose | Epoxy Hexadecane | alcohol (non-imaged) |

Table III delineates examples of polymer mixtures which undergo a photo-catalytically induced chain scission or depolymerization. As a result of subsequent aging or heat treatment, the polymer structure is degraded sufficiently to allow selective removal through the action of pressure, solvents, dispersants and/or heat. Photo-catalytically induced depolymerization may also result in conversion of the imaged areas of the polymer matrix to monomeric species, in which case the imaged areas may be sufficiently volatile to be vaporized and thus remove the matrix and reveal the article. Polycarbonates which undergo facile photocatalytically induced depolymerization are described in *Polymers for High Technology—Electronics and Photonics*, Bowden and Turner, editors, ACS Symposium Series 346, 1987, Chapter 12, p. 141, I thru III, incorporated herein by reference.

TABLE III

| BASE RESINS |
|---|
| Copolymer of acrylic acid and 3, 9 divinyl |

TABLE III-continued

| BASE RESINS |
|---|
| 2, 4, 8, 10 tetraoxaspiro undecane |
| End-capped polyphthalaldehyde |
| Polybis-p-nitrophenylcarbonate of 1,4 benzenedimethanol with 2-cyclohexen-1,4-diol |

Table IV sets forth typical polymer mixtures which employ photo-activated deprotection to form a latent image which may be developed via elevated temperature heat or ambient temperature aging into a crosslinked structure.

TABLE IV

| BASE RESIN | REACTIVE DILUENT | PHOTOREMOVABLE PROTECTING GROUP | PROTECTED MOIETY |
|---|---|---|---|
| cellulose acetate-butyrate maleic anhydride/ methyl vinyl ether copolymer | glutaric dialdehyde pentaerythritol | o-nitrophenyl ethylene glycol o-nitrobenzaldehyde | aldehyde in diluent diol in diluent |
| copolymer of methyl methacrylate and diol of hydrolyzed solketol acrylate | toluene d-isocyanate | o-nitrobenzaldehyde | diol in resin |
| poly (o-nitro-benzyl methacrylate) | imino melamine-formaldehyde resin | o-nitrobenzyl | carboxyl in resin |
| ethyl cellulose | formaldehyde/ o-nitrobenzal-dehyde copolymer | o-nitrobenzaldehyde | formaldehyde in diluent |

Table V lists examples of polymer mixtures which undergo photo-activated deprotection to effect a side chain modification.

TABLE V

| BASE RESIN | REACTIVE DILUENT | PHOTOREMOVABLE PROTECTING GROUP | PROTECTED MOIETY |
|---|---|---|---|
| poly (methyl vinyl ether/ maleic anhydride) copolymer | n-butanol pair | o-nitrobenzaldehyde | n-butanol |
| cellulose acetate | succinic anhydride | o-nitrobenzaldehyde | hydroxyl groups on cellulose acetate |

Polymers which undergo chain scission following aging and/or thermal treatment of photo-deprotected areas include, for example, copolymers of polyphthalaldehyde and 2-nitrobenzaldehyde, and polycarbonate terpolymers of carbon dioxide, 2-nitrobenzylglycidyl ether and propylene oxide.

It should be appreciated that the catalytic and protecting group reaction mechanisms are readily combined to enable greater material design flexibility. For instance, reactive functionalities within the polymer mixture may be protected by moieties which undergo an actinically catalyzed cleavage. Such catalytically sensitive protective moieties have been used most extensively in the synthesis of peptides, while in the plastics industry, amino resins which contain protected aldehyde functionalities are routinely employed as acid-catalyzed cross-linking compounds for a wide variety of polymers.

The following table lists typical examples of copolymer mixtures wherein combined reaction mechanisms are effected.

TABLE VI

| BASE RESIN | REACTIVE DILUENT | MECHANISM |
| --- | --- | --- |
| Ethyl cellulose, Polyvinyl alcohol | Hexamethoxymelamine resin | Photo-cationic catalyst deprotects aldehyde in diluent resin. Upon heating cross links amino function in maleimide protected with catalytically removable t-Boc. |
| Blocked maleimide/styrene copolymer | Epoxy resin | |

Thus it will seen that there is provided an actinic activation article shaping system and method which achieves the various aspect features and considerations of the present invention and which is well suited to meet the conditions of practical usage. As various changes might be made in the actinic activation article shaping system and method as above set forth, it is to be understood that all matter herein described or shown in the accompanying drawings is to be interpreted as illustrative and not in a limiting sense.

Having thus described the invention there is claimed as new and desired to be secured by Letters Patent:

1. A method of forming the three dimensional configuration of an article from a plurality of sheets of polymer material, the thickness of each sheet corresponding to an incremental heighth of the article, the method comprising:
   a) facilitating the curing of at least a portion of the polymer material of each sheet by exposing each sheet to radiation from an actinic energy source, the radiation being configured in a pattern corresponding to said incremental heighth of the article;
   b) stacking successive sheets over previously exposed sheets to form a matrix;
   c) segregating the shape of the article from the matrix by exposing the entire matrix to an energy source which is not configured in a pattern to cure the portions of the polymer material whose curing has been facilitated and thereafter;
   d) simultaneously removing from all of the sheets which comprise the matrix, the portions of each sheet which do not comprise the configuration of the article.

2. A method of forming the three dimensional configuration of an article from a plurality of sheets of polymer material in accordance with claim 1 wherein the polymer material comprises a base resin, a reactive diluent constituent and a reaction modifying constituent, the step of facilitating the curing of a portion of the polymer material of each sheet including effecting an actinic conversion of the reaction modifying constituent.

3. A method of forming the three dimensional configuration of an article from a plurality of sheets of polymer material in accordance with claim 2 wherein the actinic conversion of the reaction modifying constituent is effected by catalysis.

4. A method of forming the three dimensional configuration of an article from a plurality of sheets of polymer material in accordance with claim 2 wherein the actinic conversion of the reaction modifying constituent is effected by actinic deprotection.

5. A method of forming the three dimensional configuration of an article from a plurality of sheets of polymer material in accordance with claim 1 wherein the step of removing the portions of each sheet which do not comprise the configuration of the article is effected by dispersion.

6. A method of forming the three dimensional configuration of an article from a plurality of sheets of polymer material in accordance with claim 1 wherein the energy source employed for the step of segregating comprises a heat energy source.

7. A method of forming the three dimensional configuration of an article from a plurality of sheets of polymer material in accordance with claim 6 wherein the matrix is heated to a temperature above the glass transition temperature of the polymer material.

8. A method of forming the three dimensional configuration of an article from a plurality of sheets of polymer material in accordance with claim 1 wherein the portions of each sheet which do not comprise the configuration of the article are removed by chemical dissolution.

9. A method of forming the three dimensional configuration of an article from a plurality of sheets of polymer material in accordance with claim 1 wherein the step of removing the portions of each sheet which do not comprise the configuration of the article is effected by heating the matrix.

10. A method of forming the three dimensional shape of an article from a plurality of sheets of polymer material in accordance with claim 1 wherein the step of stacking successive sheets is subsequent to the step of facilitating.

11. A method of forming the three-dimensional configuration of an article from a plurality of sheets of polymer material in accordance with claim 1 wherein the step of stacking occurs prior to the step of facilitating.

12. A method of forming the three dimensional configuration of an article, the method comprising the steps of:
   a) providing a plurality of sheets of polymer material, the thickness of each sheet corresponding to an incremental heighth of the article,
   b) providing means for exposing an actinic radiation image patterned to correspond with the configuration of an incremental heighth of the article on a sheet of the plurality,
   c) exposing actinic radiation images patterned to correspond with configurations of successive incremental heighths of the article on successive sheets of the plurality to effect a change of chemical reactivity on each of the successive sheets corresponding to the patterned images exposed on each sheet, d) providing means for stacking successive sheets of the plurality on previously exposed sheets to form a matrix, e) providing an unpatterned energy source for segregating the configuration of the article from the matrix by effecting a reactive change in the molecular structure of the polymer material of each of the sheets which comprise the matrix as a function of the differential in the chemical reactivity between the exposed and unexposed portions of each sheet, f) segregating the configuration of the article from the matrix by effecting a reactive change in the molecular structure of the polymer material of each of the sheets as a function of the differential in chemical reactivity by exposing the matrix to the unpatterned energy source, and g) providing means for separating the segregated configuration of the article from the matrix by altering the dimensional stability of the polymer material as a function of the changed molecular structure.

13. A method of forming the three-dimensional configuration of an article from a plurality of sheets of polymer material, the thickness of each sheet corresponding to an incremental heighth of the article, the method comprising:

(a) facilitating the curing of at least a portion of the polymer material of each sheet by exposing each sheet to actinic radiation configured in the shape of an incremental heighth of the article, (b) stacking successive exposed sheets over previously exposed sheets to form a matrix, (c) curing the portions of the polymer material whose curing has been facilitated to segregate the shape of the article from the matrix, and (d) simultaneously removing from all of the sheets which comprise the matrix, the portions of each sheet which do not comprise the configuration of the article.

14. A method of forming the three dimensional configuration of an article, the method comprising the steps of:

a) providing a plurality of sheets of polymer material, the thickness of each sheet corresponding to an incremental heighth of the article, b) exposing actinic radiation images patterned to correspond with configurations of successive incremental heighths of the article on successive sheets of the plurality to effect a change of chemical reactivity on each of the successive sheets corresponding to the patterned images exposed on each sheet, c) stacking successive sheets of the plurality on previously exposed sheets to form a matrix, d) segregating the configuration of the article from the matrix by effecting a reactive change in the molecular structure of the polymer material of each of the sheets which comprise the matrix as a function of the differential in the chemical reactivity between the exposed and unexposed portions of each sheet, and e) separating the segregated configuration of the article from the matrix by altering the dimensional stability of the polymer material as a function of the changed molecular structure.

* * * * *